United States Patent
Erdmann

(10) Patent No.: US 8,487,792 B2
(45) Date of Patent: Jul. 16, 2013

(54) METHOD OF GAIN CALIBRATION OF AN ADC STAGE AND AN ADC STAGE

(75) Inventor: Christophe Erdmann, Caen (FR)

(73) Assignee: Integrated Device Technology Inc., San Jose, CA (US)

( * ) Notice: Subject to any disclaimer, the term of this patent is extended or adjusted under 35 U.S.C. 154(b) by 50 days.

(21) Appl. No.: 13/121,951

(22) PCT Filed: Oct. 5, 2009

(86) PCT No.: PCT/IB2009/054340
§ 371 (c)(1),
(2), (4) Date: Aug. 11, 2011

(87) PCT Pub. No.: WO2010/041187
PCT Pub. Date: Apr. 15, 2010

(65) Prior Publication Data
US 2011/0285564 A1 Nov. 24, 2011

(30) Foreign Application Priority Data
Oct. 6, 2008 (EP) .................................. 08105495

(51) Int. Cl.
*H03M 1/06* (2006.01)
(52) U.S. Cl.
USPC ........................... 341/118; 341/119; 341/155
(58) Field of Classification Search
USPC .................................. 341/117–118, 120, 155
See application file for complete search history.

(56) References Cited

U.S. PATENT DOCUMENTS

| | | | |
|---|---|---|---|
| 6,140,948 A | 10/2000 | Yu | |
| 6,351,229 B1 | 2/2002 | Wang | |
| 6,822,601 B1 | 11/2004 | Liu et al. | |
| 7,095,346 B2 * | 8/2006 | Bogner | 341/120 |
| 7,602,323 B2 * | 10/2009 | Galton et al. | 341/118 |
| 2005/0137802 A1 | 6/2005 | Maloberti et al. | |
| 2005/0275578 A1 | 12/2005 | Bjornsen | |
| 2007/0176814 A1 | 8/2007 | Grace | |

FOREIGN PATENT DOCUMENTS

| | | |
|---|---|---|
| EP | 1 441 445 A1 | 7/2004 |
| WO | 01/67614 A1 | 9/2001 |
| WO | 01/95494 A1 | 12/2001 |

OTHER PUBLICATIONS

Ming, J., et al, "An 8-bit 80 Msample/s Pipelined Analog-to-Digital Converter with Background Calibration," IEEE J. of Solid State Circuits, vol. 36, No. 10, pp. 1489-1497 (Oct. 2001).
Ginés, A., et al. "Noisy Signal Based Background Technique for Gain Error Correction in Pipeline ADCs,"; IEE Proc.-Comput. Digit. Tech., vol. 152, No. 1, pp. 53-63 (Jan. 2005).
Keane, J., et al. "Background Interstage Gain Calibration Technique for Pipelined ADCs," IEEE Trans. on Circuits and Systems-I: Regular Papers, vol. 52, No. 1, pp. 32-43 (Jan. 2005).
International Search Report and Written Opinion for Int'l. Patent Application No. PCT/IB2009/054340 (Dec. 3, 2009).

* cited by examiner

*Primary Examiner* — Jean B Jeanglaude
(74) *Attorney, Agent, or Firm* — Hayes and Boone LLP

(57) ABSTRACT

A method of gain calibration of an ADC stage is provided. The method includes steps of receiving an input analog signal, converting the input analog signal into an m-bit digital signal by means of an analog to digital converter, generating a calibration signal by means of a random number generator, adding the calibration signal to the m-bit digital signal to produce an adjusted m-bit digital signal, converting the adjusted m-bit digital signal into an adjusted partial analog signal by means of a digital to analogue converter, subtracting the partial analog signal from the input analog signal, to produce a residual analog signal, amplifying the residual analog signal. The the calibration signal may take any one of three values and may be constrained to one of only two of these three values. An ADC stage adapted to operate according to the method is also provided.

11 Claims, 3 Drawing Sheets

|  | sub-range 0 51 | | | sub-range 1 ... (n-1) 52 | | | sub-range n 53 | | |
|---|---|---|---|---|---|---|---|---|---|
| Random State 57 | Random generator 54 | Calibration Signal 55 | Transfer function 56 | Random generator 54 | Calibration Signal 55 | Transfer function 56 | Random generator 54 | Calibration Signal 55 | Transfer function 56 |
| state1 | +1 | Positive | Tf1 | +1 | Positive | Tf1 | -1 | Negative | Tf3 |
| state2 | 0 | Null | Tf2 | 0 | Null | Tf2 | 0 | Null | Tf2 |
| state3 | 0 | Null | Tf2 | 0 | Null | Tf2 | 0 | Null | Tf2 |
| state4 | +1 | Positive | Tf1 | -1 | Negative | Tf3 | -1 | Negative | Tf3 |

Fig 5

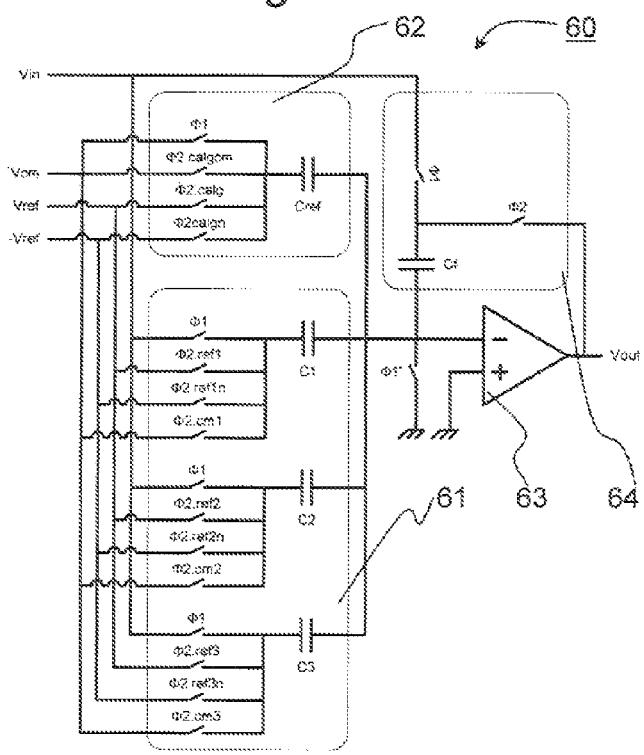

Fig 6

METHOD OF GAIN CALIBRATION OF AN ADC STAGE AND AN ADC STAGE

FIELD OF THE INVENTION

This invention relates to a method of calibrating analog to digital converters, and in particular to a method of calibrating the gain of an analogue to digital converter stage. It further relates to a stage of an analogue to digital converter.

BACKGROUND OF THE INVENTION

Analog to digital converters (ADCs) are widely used in the many fields to convert an analog signal into a corresponding digital signal. The analog signal may be from any one of a wide variety of sources, such as wireless telephonic, other audio, video or data transmissions. Due in part to the generally higher flexibility and adaptability and lower cost associated with the hardware required for digital processing, digital processing of such analog signals is often desirable. Furthermore, digital storage is much more convenient than analogue storage. For these, as well as many other, reasons ADCs are of significant importance in the electronics and communications industry.

The accuracy and linearity of ADCs is of particular importance, and increasingly so when the taken in conjunction with modern trends to increase the proportion of signal processing which is carried out in the digital domain. A typical example is software defined radio (SDR), in which virtually all of the signal processing is carried out in the digital domain. For such applications, high sensitivity and highly linear ADCs are required, having a wide range.

For such reasons as well as others, it is important to be able to effectively calibrate the gain of an ADC in order to determine its linearity, and to correct for non-linearities if appropriate. Calibration may be carried out as part of the manufacturing and assembly of the device; however, alternative techniques such as background calibration are becoming increasingly common. These have the advantage that calibration may be carried out over the lifetime of the device, and do not require connection to expensive external calibration equipment, or the additional time required to connect to such equipment and carry out calibration as part of assembly and test.

An example of background gain calibration is disclosed in the paper. "*Background into stage gain calibration technique for pipelines ADCs*" by Keane, Hurst and Lewis, in IEEE transactions on circuits and systems—52(1) January 2005, p 32-43.

One method of gain calibration involves injecting a pseudo-random calibration signal into the amplifier, along with the amplifier input. An example of such a system is shown in FIG. 1. FIG. 1 shows a m-bit pipeline stage of an ADC, with gain calibration. In this example of an m-bit stage, m is an integer. The pipeline stage includes an ADC 1, which is connected to the input signal Vin. The ADC 1 converts the analog input signal Vin into an m-bit digital signal. The m-bit digital signal is input into a Digital to Analogue Converter (DAC) 2, which converts the digital signal back to a partial analog signal. The resulting partial analog signal is subtracted from the original input signal at adder 3. The residual signal, corresponding to the difference between the input analog signal and the partial analog signal is amplified in an amplifier 4 having a gain g. The amplified residual signal, Vout, is passed to the subsequent stage of the pipeline ADC. In a practical ADC pipeline stage, both the ADC and the DAC will introduce an error. In order to calibrate the stage, a known error is simulated and introduced into the ADC. The effect of this known error on the ADC and the adder is then determined, and the results used to calibrate the stage. The means used to generate the known error is random generator 5. The random generator 5 (or pseudo-random generator) generates a binary digital signal, with a value either +1 or −1.

The effect of including the signal from the random number generator on the transfer curve of the amplifier stage is shown in FIG. 2. For simplicity, an ideal stage is shown, wherein the transfer function is completely linear. The figure shows the stage output (Vout), on the y-axis for the range of inputs (Vin), and the x-axis. The figure is split into n+1 "sub-ranges", from sub-range 0 on the far left of the figure to sub-range n on the far right of the figure, and which are explained in more detail herebelow; the figure is discontinuous in that not all of the ranges are shown, however, the centre two ranges, namely $(n-1)/2$, and $(n+1)/2$, are included. Two separate transfer functions, Tf1 and Tf2, are shown. Transfer function Tf1 corresponds to the transfer function including a +1 injected signal from the random generator 5; transfer function Tf2 corresponds to the transfer function including −1 injected from the random generator 5. A sub-range is a part of the full range of the input signal of the pipeline stage. ADC 1 selects the sub-range in which the input signal Vin is. The number of sub-ranges n+1 is determined by the resolution of the stage: for integer (m-bit) stage, $n+1=2^m$ and for half-integer (m-0.5-bit) stage, $n+1=(2^m)-1$.

The multi-bit pipeline stage described above uses $(2^m)-1$ where "A" denotes "raised to the power of", (i.e 2 to the power m, minus 1) capacitors and a set of switches in the DAC part. The frequency response of these capacitors and switches limits the maximum achievable working frequency of the complete converter. In order to increase the working frequency, an (m−0.5) bit stage is used (which can provide m effective bits) since only $[(2^{(m-1)})-1]$ capacitors, and a set of switches are needed, which drastically reduces the number of interest interconnections required. That is to say, the reduction of the stage resolution by half a bit, from an integer (m) to a half-integer (m−0.5), reduces the number of capacitors required by a factor greater than two. For instance, a 2.5-bit stage contains 3 capacitors while a 3-bit stage uses 7 capacitors.

In such a half integer (m−0.5) bit stage, the gain calibration as described above is no longer possible.

United States patent application publication US2005/0275578 discloses a pipeline stage gain calibration incorporating a 2-state dither signal from a random number generator. Rather than being applied as a calibration signal, the dither signal is principally used to soften parasitic spurs in a signal spectrum, in other words it is generally frequency shaped, whilst calibration signals are not; however, in principle it would be possible to apply such a dither signal in calibration or test. Depending on which sub-range of the ADC is used, the two values which can be taken by the dither signal can differ: that is to say in the left-most sub-range, and the dither signal can take on the values of 0 or +Vref/4; in the right-most sub-range, the dither signal can take the values of −Vref/4 or 0; and in all other sub ranges the to the signal can take on the values of −Vref/4 or +Vref/4.

Although US2005/0275578 provides some improvement over the previous art as regards gain calibration of an ADC stage, there still remains an ongoing need for an alternative and improved gain calibration method, and in particular for such a method which allows for convenient and simple processing and for the gain extraction.

SUMMARY OF THE INVENTION

According to the present invention there is provided a method of calibration an analog to digital converter system, comprising the following steps: receiving an input analog signal, converting the input analog signal into an m-bit digital signal by means of an analog to digital converter, generating a calibration signal by means of a random number generator, adding the calibration signal to the m-bit digital signal to produce an adjusted m-bit digital signal, converting the adjusted m-bit digital signal into an adjusted partial analog signal by means of a digital to analogue converter, subtracting the partial analog signal from the input analog signal, to produce a residual analog signal, amplifying the residual analog signal, characterised in that the calibration signal may take any one of three values. The method thus provides for the effective utilisation of the whole of the range of the ADC. Furthermore, it provides for particularly convenient extraction of the gain calibration.

Preferably the random number generator may take any one of a single negative value, zero and a single positive value, and in an exemplary embodiment the single negative value is −1, and the single positive value is +1. Since the differences between the transfer functions for the various values of the random number generator are thereby nominally equal, this provides for particularly convenient extraction of the gain calibration In a preferred embodiment, when the input analog signal lies within a lowest sub-range, the random generator is constrained to take one of the single negative value and 0. And in a yet further preferred embodiment, when the input analog signal lies within a highest sub-range, the random generator is constrained to take one of zero and the single positive value. This is particularly convenient for preventing overloading your of the ADC at the outermost sub-ranges.

According to another aspect of the invention there is provided a stage of an ADC adapted to operate according to a method as claimed in any proceeding claim. Preferably the stage is a pipeline stage, and more preferably the ADC comprises an MDAC.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which:

FIG. 5 is a state diagram for the random generator output and calibration signal according to an embodiment of the invention; and FIG. 6 is a schematic of a 2.5-bit MDAC implementation according to an embodiment of the invention.

Figure 1:
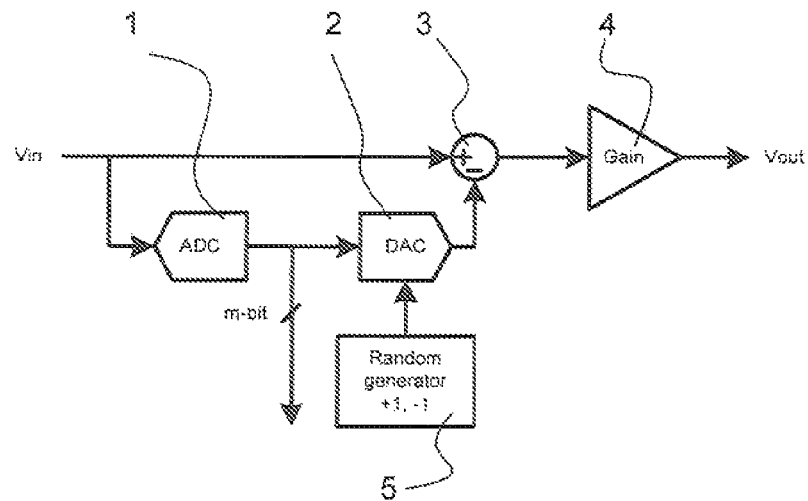
FIG. 1 is a schematic of a stage of an ADC, according to the prior art.
Figure 2:
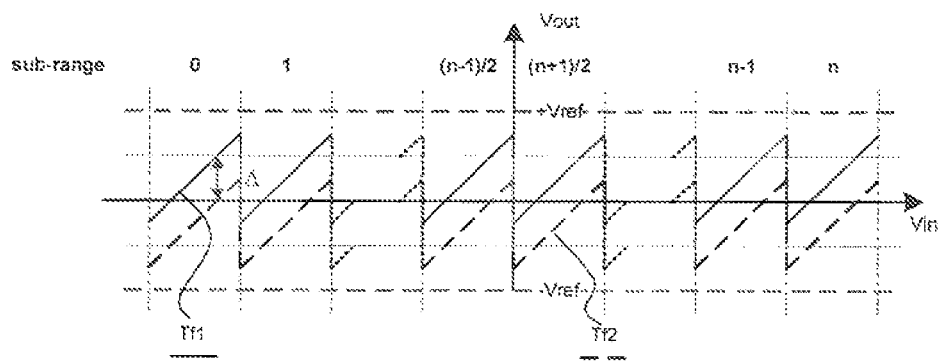
FIG. 2 shows the transfer characteristic of an ADC stage, such as that shown in FIG. 1.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 3:
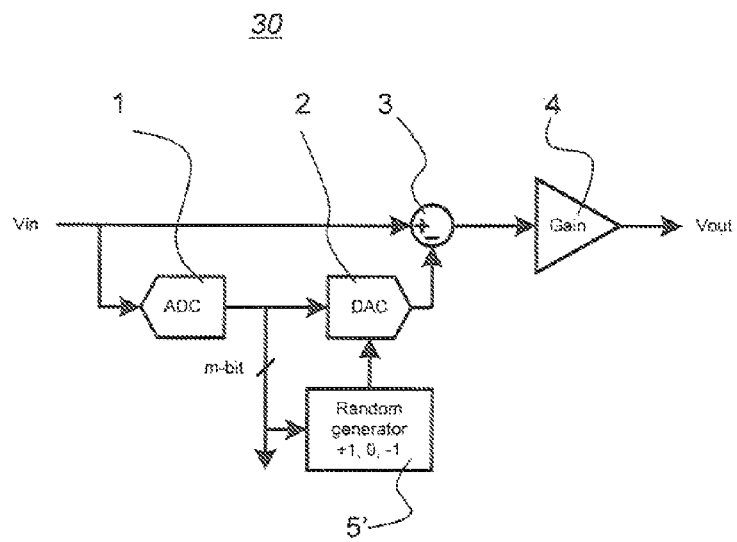
FIG. 3 is a schematic of a stage of an ADC according to an embodiment of the invention.

A pipeline stage of an ADC converter with gain calibration suitable for operation in accordance with a method according to the present invention is shown in FIG. 3. The pipeline stage 30 is structurally similar to the pipeline stage of the prior art shown in FIG. 1, in that it includes an ADC 1, connected to the input signal Vin. ADC 1 converts the analog input signal Vin into an m-bit digital signal which is input into a Digital to Analogue Converter (DAC) 2, which converts the digital signal back to a partial analog signal. The resulting partial analog signal is subtracted from the original input signal at adder 3, and the residual signal, is amplified in an amplifier 4. The amplified residual signal, Vout, is passed to the subsequent stage of the pipeline ADC. To calibrate the stage, a known error is simulated and introduced into the ADC, by means of random generator 5', along with the m-bit output signal from the ADC1. Up to this point the pipeline stage is the same as that is known in the prior art. However, in this embodiment, the random generator 5' generates a digital signal which can take on any one of three states; in this exemplary case, with value of +, 0 or −1. The outputs −1, 0 and +1 in this exemplary embodiment corresponds to −Vref/4, 0 and +Vref/4, respectively. In other embodiments three states which the random generator can take, may have values other than +1, 0 or −1. Furthermore, the voltages which the output values represents need not necessarily correspond to ±Vref/4 and 0: in other embodiments, instead of Vref/4, a different offset, up to Vref/2, by be used. Thus for instance the 3 possible outputs from the random generator 5' may correspond to the values −Vref/2, 0 and +Vref/2, or they may correspond to the values −Vref/8, 0 and +Vref/8.

In order to avoid overloading the DAC, the values which the random number generator is allowed to generate is restricted at the outermost sub-ranges. Thus, at the leftmost sub-range (sub-range 0), the random number generator is restricted to output only +1 or 0. Equivalently, at the rightmost sub-range, (sub-range n), the random number generator is restricted to output only 0 or +1. In all other ranges the random generator can output any one of the three possible values. Thus, the modified signal (which is equal to the m-bit digital signal corresponding to input signal Vin together with the calibration signal) stays within the limits of the coding capabilities for the following stages.

Figure 4:
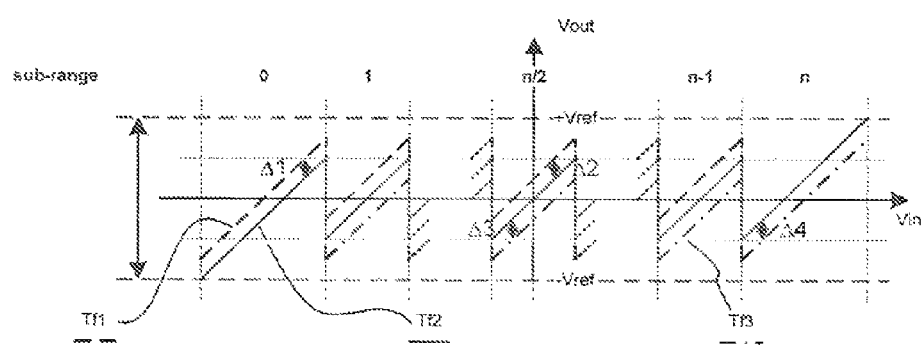
FIG. 4 is the transfer characteristic of an ADC stage such as that shown in FIG. 3.

The transfer curve of the stage including the pseudorandom calibration signal generated by the random number generator is shown in FIG. 4. In FIG. 4, the leftmost sub-range (sub-range 0) exhibits two transfer curves: the upper curve Tf1, indicated by the dashed line, corresponds to the signal with a positive calibration signal (that is to say, the random generator produces an output of +1); and the lower curve Tf2, indicated by the solid line, corresponds to the transfer curve with a null or 0 calibration signal output from the random generator. Correspondingly, the rightmost sub-range (sub-range n) exhibits two transfer curves: the uppermost curve Tf2, indicated by the solid line, corresponds to the signal with a null or 0 calibration signal, in which the random generator produces an output of 0); and the lower curve Tf3, indicated by the dot-dashed line, corresponds to the transfer curve with a negative calibration signal output from the random generator, in which the random generator produces an output of −1. In all the remaining sub-ranges, that is, any of sub-ranges 1 to (n−1), there are three transfer curves: the uppermost curve Tf1, corresponds to the signal with a positive calibration signal curve; the middle curve Tf2, corresponds to the signal with a null or 0 calibration signal; and the lower curve Tf3, corresponds to the transfer curve with a negative calibration signal output from the random generator, in which the random generator produces an output of −1.

The difference between the transfer curves Tf1 and Tf2, at the leftmost sub-range, sub-range zero, is denoted by a delta, Δ1. The equivalent difference between transfer functions Tf1 and Tf2 in the Central ranges sub ranges is denoted Δ2, and the difference between the transfer functions Tf2 and Tf3 in the centre ranges is denoted Δ3. Finally the difference between the transfer functions Tf2 and Tf3 in the rightmost range (that is to say, in sub-range in) is denoted by Δ4. In the case of a perfect stage with perfect gain and linearity, each of these differences would be the same and equivalent to a difference Δideal. In the exemplary embodiment, Δideal=+Vref/4; however, for other embodiments Δideal could take on a different value, such as +Vref/2; in any case, the ideal value would be known.

Seen from the viewpoint of a state diagram, the random generator can take on the four random states (57) named from the state1 to state4. These states are shown for sub-range 0 (51), sub-ranges 1 to (n−1) (52), and sub-range n (53) in FIG. 5. The Figure shows the random generator output 54, calibration signal 55 and transfer function 56, for each of sub range 0 (51), sub-ranges 1 to (n−1) (52), and sub-range n (53). It should be noted that state2 and state3 are the same, but as will be described the below, the random generator output corresponding to state2 and state3 has to occur, over time, twice as frequently as those corresponding to state1 and state4; therefore, it is included as two separate states in the table shown in FIG. 5. In sub-range 0, random state1 corresponds to a random generator +1 equal to a positive calibration signal and transfer function TF1. Random state2 and state3 corresponds to random generator output to zero, calibration signal null, and transfer function TF2. Random state4 corresponds to a random generator +1 equal to a positive calibration signal and transfer function TF1. In the centre sub-ranges, that is to say in sub-ranges 1 through (n−1), states 1 through 3 correspond to those in the leftmost sub range: that is to say state1 has transfer function Tf1, random generator +1 positive calibration signal, whilst state2 and state3 have transfer function Tf2, random generator 0, and null calibration signal. However, the centre sub-ranges have different state4, which in this case has a random generator with a value of −1, negative calibration signal, and transfer function Tf3. The rightmost sub-range, sub-range n, has states 2 through 4 equivalent to those in the centre sub-ranges: that is to say, state2 and state3 have random generator output 0, corresponding to a null calibration signal and transfer function Tf2, whilst state4 has random generator output −1, corresponding to negative calibration signal and transfer function Tf3. However, the rightmost sub-range has a different state 1 to the centre sub-ranges: that is to say, the random generator output is −1, calibration signal is negative, and the transfer function is Tf3.

The determination of the gain error $\epsilon$gain, is dependent on the sub-range in which the input signal is located:

If the input signal is in the leftmost sub-range, sub-range 0, then:

$\epsilon\text{gain}=(\Delta 1-\Delta\text{ideal})/\Delta\text{ideal}$, where $\Delta 1=\text{Tf1}-\text{Tf2}$. If the input signal is in a centre sub-range, i.e. one of sub-ranges 1 through (n−1), then:

$\epsilon\text{gain}=(\Delta 2+\Delta 3-2\cdot\Delta\text{ideal})/(2\cdot\Delta\text{ideal})$, where where $\Delta 2=\text{Tf1}-\text{Tf2}$, and $\Delta 3=\text{Tf2}-\text{Tf3}$. Finally, if the input signal is in the rightmost sub-range, sub-range n, then:

$\epsilon\text{gain}=(\Delta 4-\Delta\text{ideal})/\Delta\text{ideal}$, where $\Delta 4=\text{Tf2}-\text{Tf3}$. In all cases of this embodiment, $\Delta\text{ideal}=+\text{Vref}/4$. From these equations, it will be seen that, in order to cancel out from the equations during the processing, the null calibration signal has to be generated twice as much as positive or negative calibration signal. The null calibration signal corresponds physically to the connection of Cref to Vcm, the positive calibration signal corresponds physically to the connection of Cref to −Vref and finally the negative calibration signal corresponds physically to the connection of Cref to +Vref, since the MDAC described below with reference to FIG. 6 has an inversion function with respect to the voltages connected to Cref, C1, C2 and C3.

In FIG. 6 is shown a schematic diagram of a pipeline stage of an ADC suitable for implementing the method of the invention. In the figure is shown a 2.5-bit MDAC (multiplying digital to analogue converter), although the invention is not limited to such a converter, and is applicable to other converters for instance general pipeline stages such as current-mode and voltage-mode implementation of pipeline stages.

In the pipeline stage 60 comprises a DAC part 61, together with a calibration part 62, amplifier 63, and feedback stage 64. The 2.5-bit MDAC comprises three capacitors C1, C2 and C3, which are individually switchable by means of switches $\phi 1$ and $\phi 2$. In turn switch $\phi 2$ has three sub-switches for each capacitor: those for capacitor C1 are $\phi 2.\text{ref1}$, $\phi 2.\text{ref1}n$, and $\phi 2.\text{cm1}$, those for capacitor C2 are $\phi 2.\text{ref2}$, $\phi 2.\text{ref2}n$, and $\phi 2.\text{cm2}$, and similarly, those for C3 are $\phi 2.\text{ref3}$, $\phi 2.\text{ref3}n$, and $\phi 2.cm^3$. Sub-switches refx, refxn and cmx (where x is 1, 2 or 3) are connected to the voltage references Vref, −Vref and Vcm respectively. Switch $\phi 1$ switches the input Vin to each of the capacitors C1, C2 and C3, as well as to capacitor Cf, which is in the feedback section 64 and feedback around amplifier 63 when $\phi 1$ is open and $\phi 2$ is closed. Switch $\phi 1'$ is a delayed version of $\phi 1$. Gain calibration reference capacitor Cref is switchable to inputs Vcm, Vref and −Vref by means of switches $\phi 2.\text{calgcm}$, $\phi 2.\text{calg}$, and $\phi 2.\text{calgn}$. The output of capacitors C1, C2, C3 and Cref are connected to the negative input of differential amplifier 63, the positive input of which is grounded. The output of amplifier 63 provides the output Vout of the stage.

In order to obtain a calibration signal Δideal that correspond to Vref/4, Cref value should be equal to a quarter of the DAC capacitor C1, C2 and C3. More generally, the ratio Cref/C, where C is the value of C1, C2 and C3 (and Cf), sets the calibration signal value Δideal that is equal to Δideal=Vref×Cref/C.

The pipeline stage operates as a switched capacitor stage. The time during which switch $\phi 1$ is closed is called the sampling phase and that during which $\phi 2$ is closed is the amplification phase (or hold phase or charge transfer phase). calg is a command indicating the capacitor Cref has to be connected to Vref. $\phi 2.\text{calg}$ makes a logical AND operation between both signals.

When $\phi 2.\text{calg}$ is active, Cref is connected to Vref resulting in Tf3 transfer function (negative calibration signal: −1) Connection of Cref to the positive +Vref results in a negative calibration, because the MDAC shown in Figure has an inversion function with respect to the voltages connected to Cref, C1, C2 and C3.

When $\phi 2.\text{calgn}$ is active, Cref is connected to Vrefn resulting in Tf1 transfer function (positive calibration signal: +1), again because the MDAC of FIG. 6 has an inversion function with respect to the voltages connected to Cref, C1, C2 and C3.

When $\phi 2.\text{calgcm}$ is active, Cref is connected to Vcm resulting in Tf2 transfer function (null calibration signal: 0) calg, calgn and calgcm depend on the 4 states generated by the random generator.

From reading the present disclosure, other variations and modifications will be apparent to the skilled person. Such variations and modifications may involve equivalent and other features which are already known in the art of ADCs, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of calibrating an analog to digital converter system, comprising:
   receiving an input analog signal;
   converting the input analog signal into an m-bit digital signal using an analog to digital converter;
   generating a calibration signal using a random number generator, the calibration signal being positive, null, or negative based on a state of a digital signal generated by the random number generator;
   adding the calibration signal to the m-bit digital signal to produce an adjusted m-bit digital signal;
   converting the adjusted m-bit digital signal into an adjusted partial analog signal using a digital to analogue converter;
   subtracting the partial analog signal from the input analog signal, to produce a residual analog signal; and
   amplifying the residual analog signal.

2. A method as claimed in claim 1, wherein the state of the digital signal comprises any one of three states including a negative state, zero, and a positive state.

3. The method as claimed in claim 2, wherein the negative state is −1, and the positive state is +1.

4. The method as claimed in claim 2, wherein, when the input analog signal lies within a lowest sub-range, the random generator is constrained to be the negative state and 0.

5. The method as claimed in claim 2, wherein, when the input analog signal lies within a highest sub-range, the random generator is constrained to be zero and the positive state.

6. A stage of an analog-to-digital converter (ADC), the stage of the ADC calibrating the ADC according to the method of claim 1.

7. The stage of an ADC according to claim 6, wherein the stage is a pipeline stage.

8. A method of calibrating an analog to digital converter system, comprising:
   receiving an input analog signal;
   converting the input analog signal into an m-bit digital signal using an analog to digital converter;
   generating a calibration signal using a random number generator, wherein the random number generator generates a digital signal having any one of three states including a negative state, zero, and a positive state, the calibration signal being positive, null, or negative based on the state of the digital signal generated by the random number generator, and the random number generator constrained to be two of the three states based on the input analog signal;
   adding the calibration signal to the m-bit digital signal to produce an adjusted m-bit digital signal;
   converting the adjusted m-bit digital signal into an adjusted partial analog signal using a digital to analogue converter;
   subtracting the partial analog signal from the input analog signal, to produce a residual analog signal; and
   amplifying the residual analog signal.

9. The method as claimed in claim 8, wherein the negative state is −1, and the positive state is +1.

10. A stage of an analog-to-digital converter (ADC), the stage of the ADC calibrating the ADC according to the method of claim 8.

11. The stage of an ADC according to claim 10, wherein the stage is a pipeline stage.

* * * * *